(12) United States Patent
Hwang et al.

(10) Patent No.: US 7,993,994 B2
(45) Date of Patent: Aug. 9, 2011

(54) METHOD OF FORMING CRYSTALLIZED SILICON AND METHOD OF FABRICATING THIN FILM TRANSISTOR AND LIQUID CRYSTAL DISPLAY USING THE SAME

(75) Inventors: Tae-Hyung Hwang, Seoul (KR); Hyun-Jae Kim, Seoul (KR); Do-Kyung Kim, Yongin-si (KR); Woong-Hee Jeong, Seoul (KR); Choong-Hee Lee, Suwon-si (KR); Tae-Hun Jung, Seoul (KR)

(73) Assignees: Samsung Electronics Co., Ltd. (KR); Industry-Academic Cooperation Foundation, Younsei University (KR)

(*) Notice: Subject to any disclaimer, the term of this patent is extended or adjusted under 35 U.S.C. 154(b) by 153 days.

(21) Appl. No.: 12/412,682

(22) Filed: Mar. 27, 2009

(65) Prior Publication Data

US 2010/0062555 A1 Mar. 11, 2010

(30) Foreign Application Priority Data

Sep. 11, 2008 (KR) .................................. 2008-89975

(51) Int. Cl.
*H01L 21/00* (2006.01)
*H01L 21/84* (2006.01)
*H01L 21/20* (2006.01)
*H01L 21/36* (2006.01)

(52) U.S. Cl. ........... 438/166; 438/488; 438/97; 438/485

(58) Field of Classification Search .................... 438/51, 438/30, 158, 486, 97, 485, 482, 487, 489, 438/502, 509, 647, 764, 166, 488
See application file for complete search history.

(56) References Cited

U.S. PATENT DOCUMENTS

| 6,500,736 B2 * | 12/2002 | Kim et al. ..................... 438/486 |
| 7,745,293 B2 * | 6/2010 | Yamazaki et al. ............. 438/286 |
| 2009/0186437 A1 * | 7/2009 | Akimoto ........................ 438/30 |

FOREIGN PATENT DOCUMENTS

| JP | 2006-332299 | 12/2006 |
| KR | 10-0618614 | 8/2006 |
| KR | 10-0628989 | 9/2006 |

* cited by examiner

*Primary Examiner* — Chuong A. Luu
(74) *Attorney, Agent, or Firm* — Innovation Counsel LLP

(57) ABSTRACT

A method of crystallizing amorphous silicon comprises forming an amorphous silicon layer on a substrate; forming an insulating layer on the amorphous silicon layer; forming a heat distributing metal layer on the insulating layer; and forming a thermite layer on the heat distributing metal layer. Ignition heat is then applied to ignite the thermite layer and generate sufficient localized exothermic heat from the ignited thermite layer so as to crystallize the amorphous silicon layer. The substrate beneath the amorphous silicon layer can be a heat sensitive substrate which is not substantially deformed by the localized crystallizing heat applied to the top portion of the amorphous silicon layer by way of the heat distributing metal layer and the insulating layer.

32 Claims, 13 Drawing Sheets

METHOD OF FORMING CRYSTALLIZED SILICON AND METHOD OF FABRICATING THIN FILM TRANSISTOR AND LIQUID CRYSTAL DISPLAY USING THE SAME

CROSS-REFERENCE TO RELATED APPLICATION

This application relies for priority upon Korean Patent Application No. 2008-89975 filed on Sep. 11, 2008, the contents of which are herein incorporated by reference in their entirety.

BACKGROUND

1. Field of the Invention

The present disclosure of invention relates to a method of crystallizing amorphous silicon and a method of fabricating a thin film transistor and liquid crystal display using the same. More particularly, the present invention relates to a method of crystallizing amorphous silicon using thermite and a method of fabricating a thin film transistor using the same.

2. Description of Related Technology

Recently, with the development of a more informational society, research and study have been actively performed on various flat screen display apparatuses. In order to selectively drive elements of the flat screen display apparatus, an active matrix scheme has been employed. According to such an active matrix scheme, an amorphous silicon thin film transistor (TFT) or a polycrystalline silicon TFT is used as a switching device.

The polycrystalline silicon TFT can be fabricated by crystallizing amorphous silicon. However, because such a crystallizing method conventionally requires a high-temperature process, the underlying substrate of the flat screen display apparatus may be compressed, expanded, or otherwise damaged.

SUMMARY

Therefore, the present disclosure provides a method of crystallizing amorphous silicon where the method is capable of minimizing heat-induced damage to an underlying substrate such as a plastic substrate for example.

The present disclosure also provides a method of fabricating a thin film transistor using the method of crystallizing the amorphous silicon.

According to one method of fabricating a polycrystalline silicon layer, a polycrystalline silicon thin film is directly deposited on an appropriate substrate. In an alternate approach, after depositing an amorphous silicon thin film on a substrate, the resultant structure is subjected to a heat treatment of sufficient temperature so that the entire amorphous thin film becomes crystallized. However, in order to employ a low-priced glass substrate or a low-priced plastic substrate that has only low temperature resistance, a low-temperature process is required, one below the temperature needed for conventional crystallization of the entirety of an amorphous silicon thin film. Nonetheless, the present disclosure provides a method of depositing an amorphous silicon layer on a low-temperature substrate and then crystallizing the amorphous silicon.

In order to deposit an amorphous silicon layer on a substrate and then crystallize the amorphous silicon layer without excessively damaging the underlying substrate, the present disclosure employs a localized heat treatment technology, namely, one using thermite. A method of crystallizing amorphous silicon according to the present disclosure is as follows. First, an amorphous silicon layer is formed on a substrate, and an insulating layer is formed on the amorphous silicon layer. Then, after a metal layer and a thermite layer are sequentially formed on the insulating layer, the substrate is heated to thereby ignite the thermite layer, generate localized heat on a top side of the amorphous silicon layer and thereby crystallize the amorphous silicon layer with the exothermic heat released from the reaction of the thermite layer.

In one embodiment, the insulating layer includes at least one of silicon oxide (SiOx) and silicon nitride (SiNx), and the metal layer includes at least one metal selected from the group consisting of silver (Ag), copper (Cu), gold (Au), aluminum (Al), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), and niobium (Nb), or alloy of the metal.

In one embodiment, the thermite layer includes a mixture of very small particles (e.g., nano-particles) of metal, such as aluminum (Al), adjacent to very small particles (e.g., nano-particles) of one or more metal oxides. Nano-particles are sized between 1 and 100 nanometers in terms of diameter. When ignited to react, the combination of the particles of aluminum (Al) and the particles of metal oxide(s) exhibits an exothermic reaction temperature of about 1000° C. or more under adiabatic conditions. In one embodiment, the metal oxide is at least one oxide of an element selected from the group consisting of: silver (Ag), iron (Fe), nickel (Ni), titanium (Ti), cobalt (Co), chromium (Cr), vanadium (V), thallium (Ti), molybdenum (Mo), tungsten (W), niobium (Nb), boron (B), lead (Pb), manganese (Mn), silicon (Si), and uranium (U).

In one embodiment, the thermite layer is deposited on the metal layer in a liquid phase which contains a dispersion medium. Accordingly, the thermite layer may be formed on the metal layer through a spin-coating or an ink-jetting process. After drying of the dispersion medium, the thermite layer can be ignited by applying at least a prespecified minimum ignition temperature.

Since the localized high temperature occurs on a top side of the amorphous thin film, away from the side where the substrate is located, the substrate may include a flexible substrate material (e.g., a plastic material) having relatively low heat resistance.

The present disclosure provides a method of fabricating a thin film transistor substrate for a liquid crystal display or an organic light emitting display using the method of locally crystallizing the amorphous silicon. In the method of fabricating the thin film transistor substrate, after preparing a substrate, a gate electrode is formed on the substrate, and a gate insulating layer is formed on the substrate. Thereafter, an amorphous silicon layer is formed on the gate insulating layer, and the amorphous silicon layer is crystallized through the method of crystallizing the amorphous silicon. Source and drain electrodes are formed on the substrate having the crystallized amorphous silicon.

The thin film transistor substrate is applicable to various display apparatuses. The liquid crystal display can be manufactured by preparing a substrate facing the thin film transistor substrate and interposing a liquid crystal layer between the two substrates.

Since heat is locally applied using thermite to crystallize a silicon thin film, the method of crystallizing the amorphous silicon according to the present disclosure is applicable to a substrate having low temperature resistance.

BRIEF DESCRIPTION OF THE DRAWINGS

The above and other advantages of the present disclosure of invention will become readily apparent by reference to the following detailed description when considered in conjunction with the accompanying drawings wherein.

DETAILED DESCRIPTION

Figure 1A:
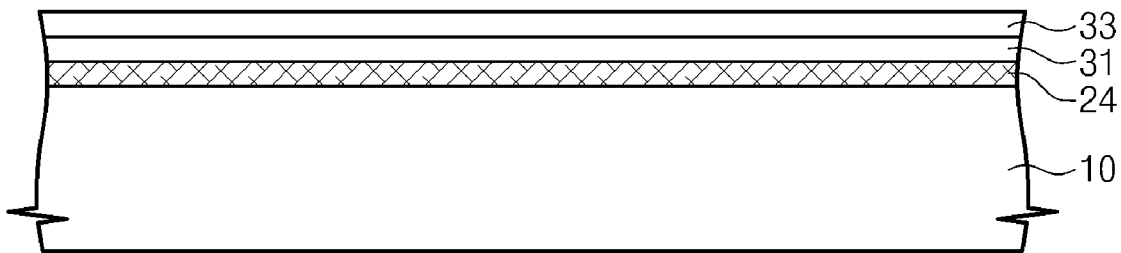
FIGS. 1A to 1D are sectional views sequentially showing a method of crystallizing amorphous silicon according to an exemplary embodiment.

Hereinafter, a display apparatus according to an exemplary embodiment will be described in detail with reference to accompanying drawings. It should be understood that the present disclosure is not to be taken as limited to what is shown in the drawings but rather as also teaching various modifications, equivalents and alternatives that are within the spirit and scope of the present disclosure. The drawings can be simplified or magnified to clearly express a plurality of layers and regions. In the drawings, the same reference numerals are used to designate same elements.

As used herein, the expression, "one film (layer) is formed (disposed) 'on' another film (layer) includes not only a case wherein the two films (layers) are in contact with each other but also a case wherein an additional film (layer) is present between the two films (layers).

FIGS. 1A to 1D are sectional views sequentially showing the method of crystallizing amorphous silicon according to an exemplary embodiment.

As shown in FIG. 1A, a substantially amorphous silicon layer 24 is formed on a top major surface of a substrate 10, where the top major surface defines a transparent and electrically insulating layer (e.g., a plastic layer).

The substrate 10 may include a flexible substrate which is heat-sensitive (e.g., is deformed by high temperatures) such as a plastic substrate. The substrate 10 may also include a typical glass layer or a quartz layer.

In order to deposit the amorphous silicon layer 24, low temperature and low pressure chemical vapor deposition (LPCVD) or plasma enhanced chemical vapor deposition (PECVD) may be carried out.

Further, although not shown, a blocking layer (barrier layer) may be interposed between the substrate 10 and the amorphous silicon layer 24. The blocking layer blocks impurities such as sodium (Na) that may exist in the substrate 10 from infiltrating into an upper layer in the process of the crystallization.

An insulating layer 31 is formed on the deposited amorphous silicon layer 24. The insulating layer 31 prevents metal from a next provided metal layer 33, from infiltrating into the amorphous silicon layer 24. For example, infiltrating metal may react with the silicon and form undesirable metal silicides directly on or in silicon layer 24. The insulating layer 31 may include insulating materials such as one or more silicon oxides ($SiO_x$) and/or silicon nitrides ($SiN_x$), where x represents compositional variables here.

The metal layer 33 is formed on the insulating layer 31. The metal layer 33 is preferably one that can transfer heat uniformly over the entire surface of the to-be-crystallized amorphous silicon layer 24. Preferably, the metal layer 33 includes metal having high thermal conductivity. Preferably, the metal having the high thermal conductivity includes silver (Ag), copper (Cu), gold (Au), aluminum (Al), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), niobium (Nb), or alloy thereof. In particular, silver (Ag), which has the highest thermal conductivity among the listed options is most preferred to be included in metal layer 33. Of course, silver tends to be expensive and thus metal layer 33 will often comprise other metals besides just silver.

Figure 1B:
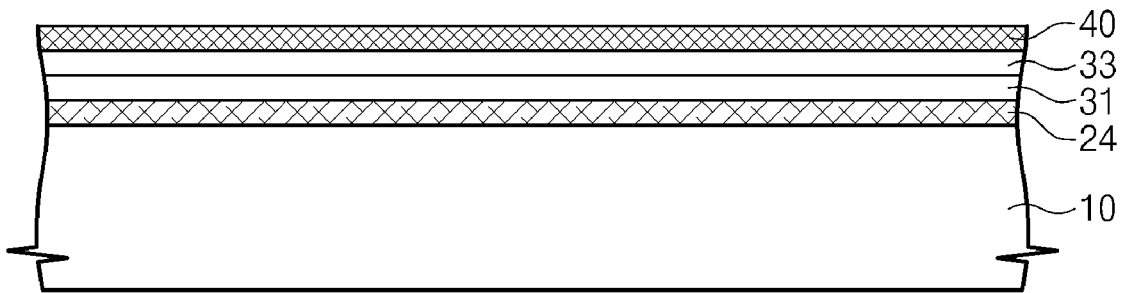

Next, as shown in FIG. 1B, a first thermite layer 40 is formed on the metal layer 33. In one embodiment, the first thermite layer 40 includes a mixture of small sized particles (e.g., nano-particles) of metal, such as aluminum (Al), magnesium (Mg), calcium (Ca), titanium (Ti), silicon (Si) and boron (B), and small sized particles (e.g., nano-particles) of an appropriate metal oxide that will exothermally react with the metal particles. Though silicon is not comprised in metal group conventionally, however, it should be understood that silicon will be described as a kind of metal due to its metallic property.

If nano-particles of aluminum (Al) and nano-particles of metal oxide are used, reaction contact area between the aluminum (Al) and the metal oxide is maximized, so that chemical reaction between the two can proceed rapidly and uniformly. In addition, the thermite layer 40 having nano-particles of both reactants can be easily coated over the substrate 10.

In order to form the first thermite layer 40 on the metal layer 33, thermite is preferably prepared in the form of a liquid phase to be easily coated on the substrate 10. According to one embodiment, the nano-particles of aluminum (Al) and the nano-particles of the metal oxide are dispersed in a desired dispersion medium and mixed at a cool temperature. Any solvent that is capable of dispersing the mixture of the nano-particles of the aluminum (Al) and nano-particles of the metal oxide such that the mixture has a desired viscosity in a liquid phase can be used as the dispersion medium. However, the present disclosure does not limit the type of solvent to be used.

The first thermite layer 40 may be formed through an ink-jetting scheme, a spin-coating scheme, or a printing scheme. The spin-coating scheme may be employed when the first thermite layer 40 is formed on the entire surface of the substrate 10. When the first thermite layer 40 is to be formed only on one or more specific regions of the substrate 10, then the ink-jetting scheme or the printing scheme is preferably employed.

After forming the first thermite layer 40, the dispersion medium (e.g., solvent) is removed through a low temperature drying process or the like, so that only the nano-particles of the aluminum (Al) and nano-particles of the metal oxide remain in mixed disposition with each other for later causing the exothermic thermite reaction to take place on top of the metal heat transfer layer 33.

Thereafter, the first thermite layer 40 is heated, for example by heating the substrate 10 so as to thereby ignite and react the first thermite layer 40. A possible reaction of the first thermite layer 40 is shown in the below first chemical reaction formula 1. The "Q" in the first chemical reaction formula 1 represents heat exothermically released by the reaction. In this case, the reaction of the first thermite layer 40 corresponds to an exothermic reaction wherein "Q" has a positive value, and the heat, which is released by the thermite reaction is sufficient to crystallize the amorphous silicon layer 24.

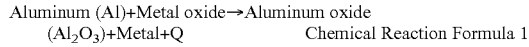

Aluminum (Al)+Metal oxide→Aluminum oxide ($Al_2O_3$)+Metal+Q        Chemical Reaction Formula 1

The metal oxide, which participates in the thermite reaction with the aluminum (Al) as shown in chemical reaction formula 1 may include one or more oxides of silver (Ag), iron (Fe), nickel (Ni), titanium (Ti), cobalt (Co), chromium (Cr), vanadium (V), thallium (Ti), molybdenum (Mo), tungsten (W), niobium (Nb), boron (B), lead (Pb), manganese (Mn), silicon (Si), or uranium (U), or mixtures of the above oxides.

Since a high local temperature is required to crystallize the amorphous silicon layer 24, the metal oxide is preferably selected among metal oxides which have a reaction temperature of at least 1000° C. during the thermite reaction. Table 1 shows chemical reaction formulae and reaction temperatures of the metal oxides causing the thermite reactions that have reaction temperatures of about 1000° C. and more under adiabatic conditions (see "Journal of Material Science 28 (1993) 3693-3708).

TABLE 1

| Chemical reaction formula | Temperature (K) |
|---|---|
| $Al + \frac{1}{2}Fe_2O_3 \rightarrow Fe + \frac{1}{2}Al_2O_3$ | 3622 |
| $Al + \frac{3}{2}NiO \rightarrow \frac{3}{2}Ni + \frac{1}{2}Al_2O_3$ | 3524 |
| $Al + \frac{3}{4}TiO_2 \rightarrow \frac{3}{4}Ti + \frac{1}{2}Al_2O_3$ | 1799 |
| $Al + \frac{3}{8}Co_3O_4 \rightarrow \frac{9}{8}Co + \frac{1}{2}Al_2O_3$ | 4181 |
| $Al + \frac{1}{2}Cr_2O_3 \rightarrow Cr + \frac{1}{2}Al_2O_3$ | 2381 |
| $Al + \frac{3}{10}V_2O_5 \rightarrow \frac{6}{10}V + \frac{1}{2}Al_2O_3$ | 3785 |
| $Al + \frac{3}{10}Ta_2O_3 \rightarrow \frac{6}{10}Ta + \frac{1}{2}Al_2O_3$ | 2470 |
| $Al + \frac{1}{2}MoO_3 \rightarrow \frac{1}{2}Mo + \frac{1}{2}Al_2O_3$ | 4281 |
| $Al + \frac{1}{2}Wo_3 \rightarrow \frac{1}{2}W + \frac{1}{2}Al_2O_3$ | 4280 |
| $Al + \frac{3}{10}Nb_2O_3 \rightarrow \frac{6}{10}Nb + \frac{1}{2}Al_2O_3$ | 2756 |
| $Al + \frac{1}{2}B_2O_3 \rightarrow B + \frac{1}{2}Al_2O_3$ | 2315 |
| $Al + \frac{3}{4}PbO_2 \rightarrow \frac{3}{4}Pb + \frac{1}{2}Al_2O_3$ | >4000 |
| $Al + \frac{3}{4}MnO2 \rightarrow \frac{3}{4}Mn + \frac{1}{2}Al2O3$ | 4178 |
| $Al + \frac{3}{4}SiO_2 \rightarrow \frac{3}{4}Si + \frac{1}{2}Al_2O_3$ | 1760 |
| $Al + \frac{3}{16}U_3O_8 \rightarrow \frac{9}{16}U + \frac{1}{2}Al_2O_3$ | 2135 |

Figure 2:
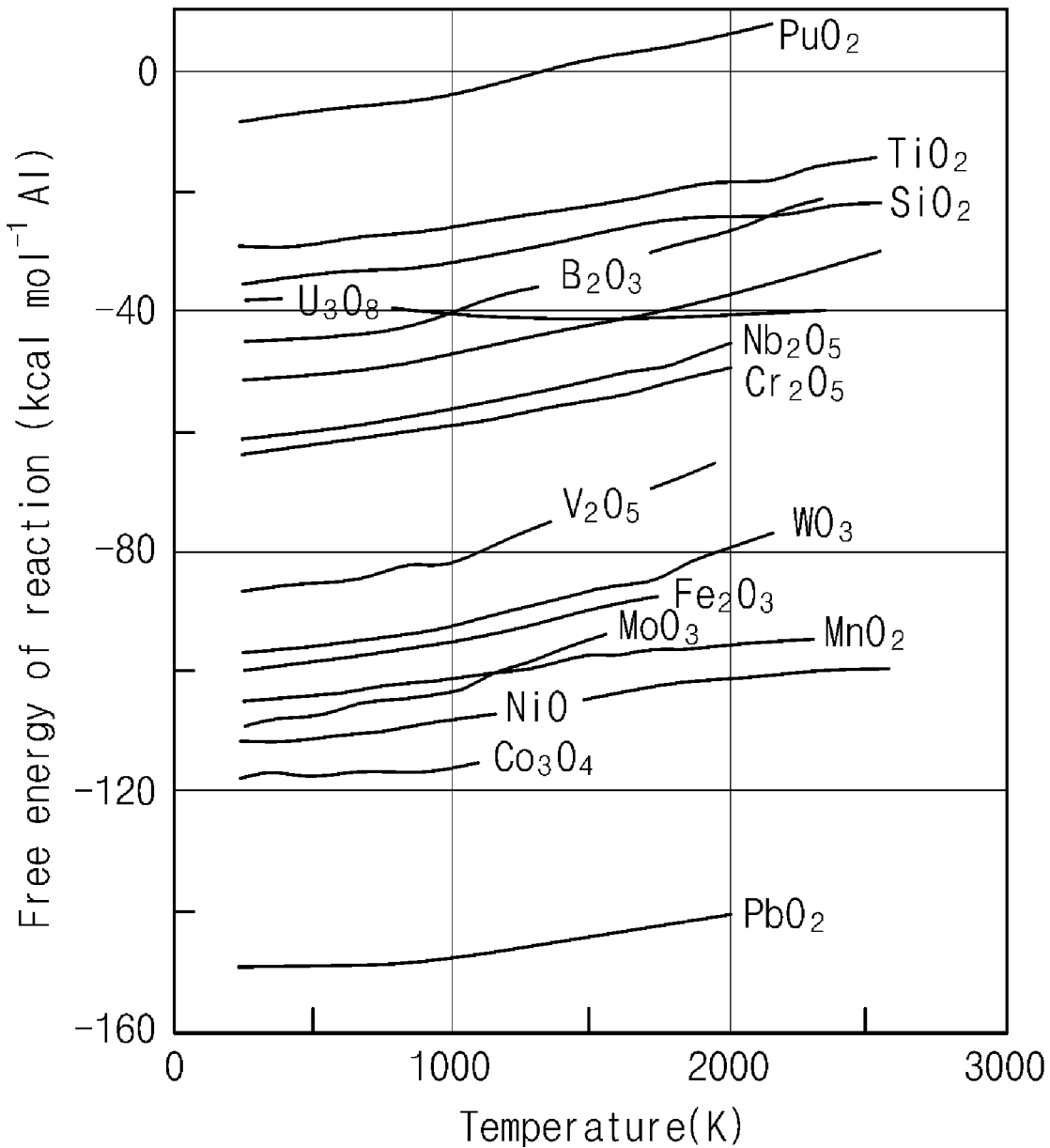
FIG. 2 is a graph showing free energy of a metal oxide used in accordance with the disclosure.

FIG. 2 is a graph showing free energy of various metal oxides that are usable in accordance with the disclosure. As shown in FIG. 2, since free energy of the metal oxide participating in the thermite reaction with aluminum (Al) has a negative value (at least for temperatures of about 1000° K.), spontaneity of reaction is very great. Accordingly, even if heat is applied to the extent that only a starting thermite reaction is ignited, the full thermite reaction may occur. According to one embodiment, heat is applied to only a portion of the substrate 10 to ignite the initiating thermite reaction. In this case, ignition temperatures are different from each other according to the type of metal oxide used. For example, an initial ignition temperature may be in the range of about 550° C. to about 650° C. in thermite reaction based on iron oxide ($Fe_3O_4$) and an ignition temperature may be about 600° C. in thermite reaction based on molybdenum oxide ($MoO_3$). An ignition temperature is about 650° C. in thermite reaction based on tungsten oxide ($WO_3$). In addition, since the thermite reaction is exothermic reaction having a large negative value of enthalpy, even if reaction is started at a portion of the substrate 10, chain reaction is subsequently caused by released heat.

Figure 1C:
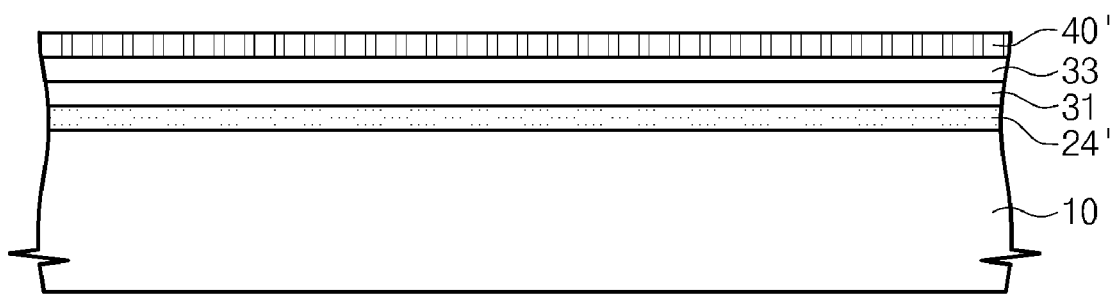

As shown in FIG. 1C, after the thermite reaction is completed, a polycrystalline silicon layer 24' is formed under insulating layer 31, metal layer 33, and the post-ignition second thermite layer 40', where the latter includes aluminum oxide and the reduced metal obtained from the thermite reaction.

If the thermite layer 40 is selectively formed only on one or more specific regions of the substrate 10, heat is locally applied to the amorphous silicon layer 24 corresponding to the regions of formation of the thermite layer 40. Accordingly, the polycrystalline silicon layer 24' can be fabricated without substantial damage to the heat sensitive substrate 10.

Figure 1D:

Next, as shown in FIG. 1D, the insulating layer 31, the metal layer 33, and the second thermite layer 40' formed on the polycrystalline silicon layer 24' are selectively removed (for example by chemical mechanical polishing or CMP), thereby leaving behind an exposed polycrystalline silicon layer, 24".

Figure 3:
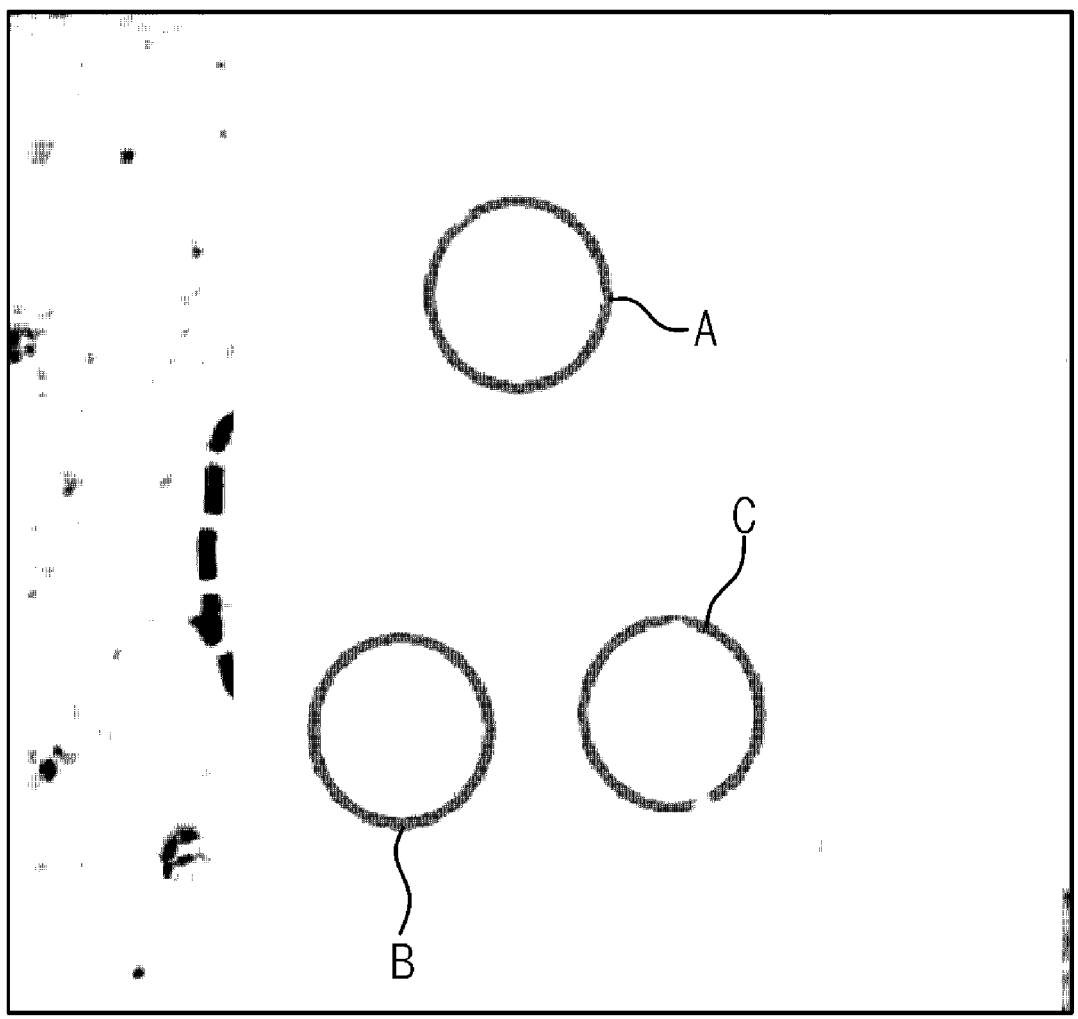
FIG. 3 is a photographic view showing a case of crystallizing amorphous silicon by using thermite when both of an insulating layer and a metal layer are not formed.
Figure 4A:
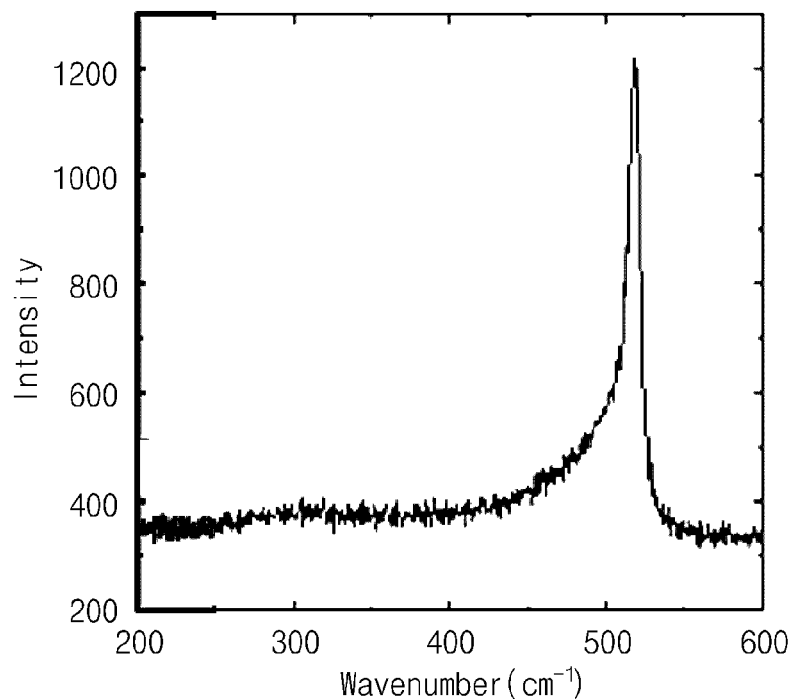
FIGS. 4A to 4C are views sequentially showing Raman spectroscopy for regions A to C of FIG. 3.
Figure 4B:
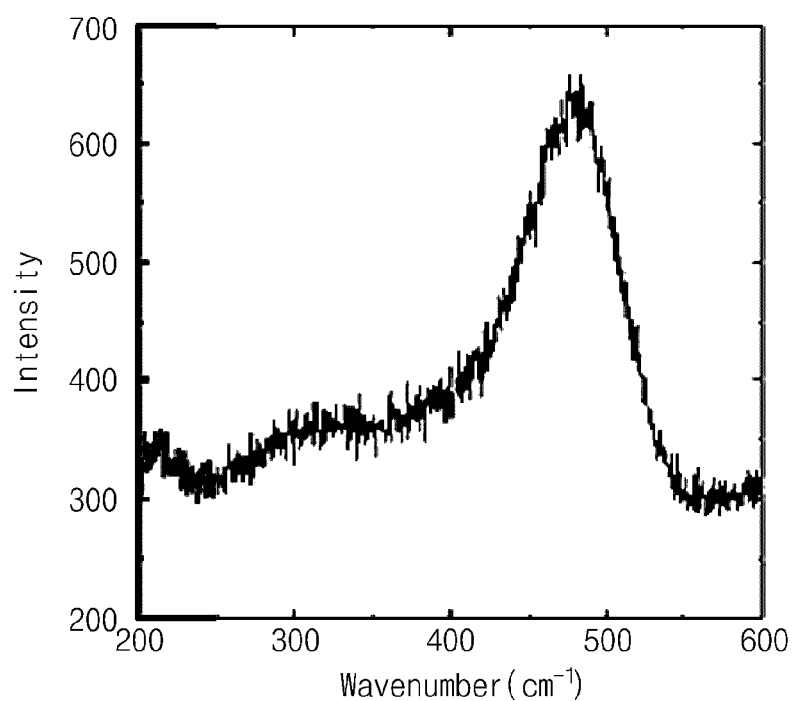
Figure 4C:
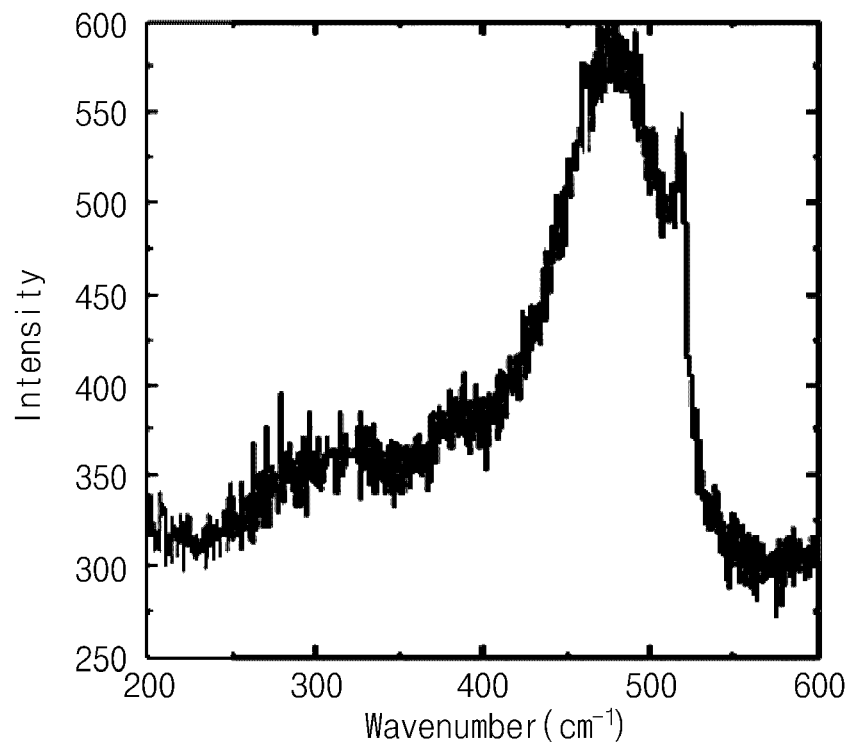

FIG. 3 is a photographic view showing a case in which the amorphous silicon layer 24 is crystallized by using the thermite layer 40 when both of the insulating layer 31 and the metal layer 33 are not formed, and FIGS. 4A to 4C are views sequentially showing Raman spectroscopy for regions A to C of FIG. 3. As shown in FIGS. 4A to 4C, it can be recognized that the polycrystalline silicon layer is formed in the region A of FIG. 3, because only a peak of polycrystalline silicon is shown in the region A. However, only a peak of amorphous silicon is observed in the region B instead of the peak of the polycrystalline silicon. For the region C, both peaks of the polycrystalline silicon and the amorphous silicon are observed in FIG. 4C thus indicating a mixture of both. Accordingly, it can be recognized that crystallization irregularly occurs in the regions A, B, and C.

Figure 5:
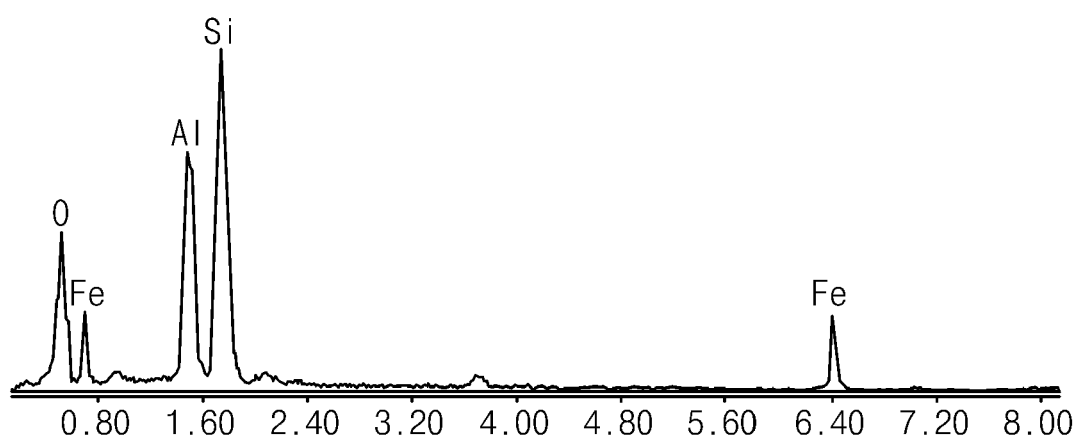
FIG. 5 is a graph showing energy dispersive X-ray spectroscopy (EDX) of a polycrystalline silicon substrate when crystallizing amorphous silicon using thermite in a state in which both of an insulating layer and a metal layer are not formed.

In addition, since the thermite reaction occurs on the amorphous silicon substrate, a metal participating in the thermite reaction of aluminum (Al) and metal oxide may infiltrate into the polycrystalline silicon layer 24'. FIG. 5 is a graph showing energy dispersive X-ray spectroscopy (EDX) of the polycrystalline silicon layer 24' when the amorphous silicon layer 24 is crystallized using the thermite layer 40 in a state in which both the insulating layer 31 and the metal layer 33 are not formed and thus do not protect the silicon from metal infiltration. As shown in the graph of FIG. 5, iron (Fe) and aluminum (Al) are contained in the polycrystalline silicon layer 24'.

Therefore, according to the present disclosure, the metal layer 33 is formed to uniformly transfer heat to the amorphous silicon layer 24. In this case, even if the thermite layer 40 is itself not coated uniformly, the metal layer 33 transfers heat to the amorphous silicon uniformly.

However, when only the metal layer 33 is formed on the amorphous silicon layer 24, while thermite reaction is occurring, metal of the metal layer 33 tends to react with silicon atoms of the amorphous silicon layer 24 to form metal silicide.

Figure 6:
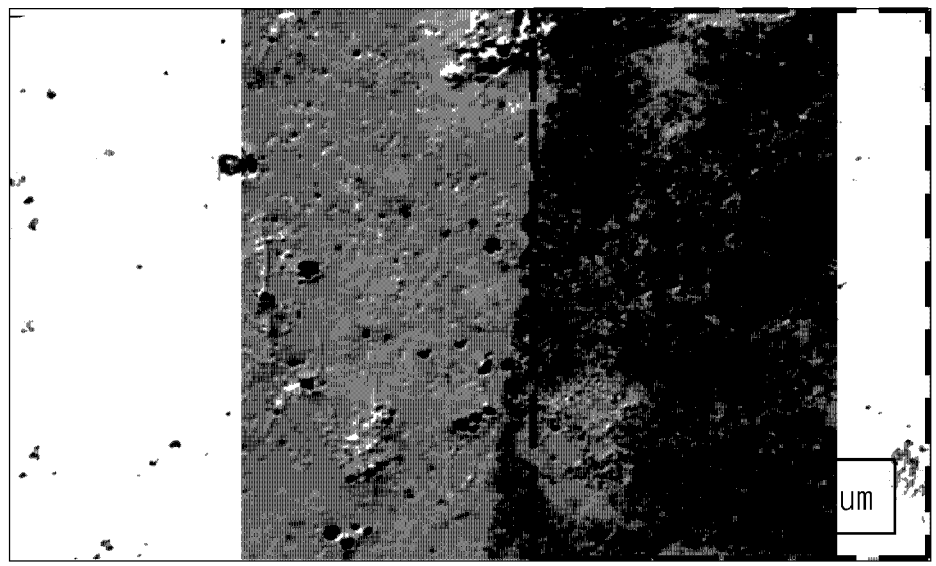
FIG. 6 is a photographic view showing a substrate after thermite reaction when silver (Ag) is used for a metal layer.

FIG. 6 is a photographic view showing a silicon layer after the thermite reaction when silver (Ag) is used for the metal layer 33. FIG. 6 shows an area which is surrounded by a dotted line and has been subject to the thermite reaction after a silver (Ag) layer is formed on the amorphous silicon layer 24. As shown in FIG. 6, dark-colored silver silicide (AgSi) is observed in place of the metal layer 33.

Accordingly, in order to prevent metal silicide from being formed due to the metal layer 33 and prevent metal used for the thermite layer 40 from infiltrating into crystallized silicon as impurities, the insulating layer 31 is additionally formed to make a double layer with the metal layer 33.

Figure 7:
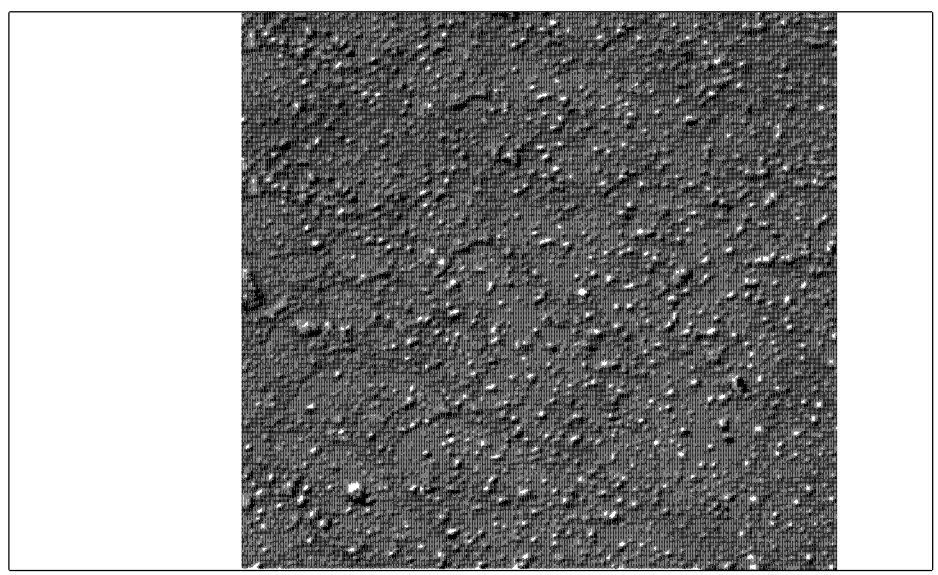
FIG. 7 is a photographic view showing a case of crystallizing amorphous silicon by using thermite when both an insulating layer and a metal layer are formed thereon.
Figure 8:
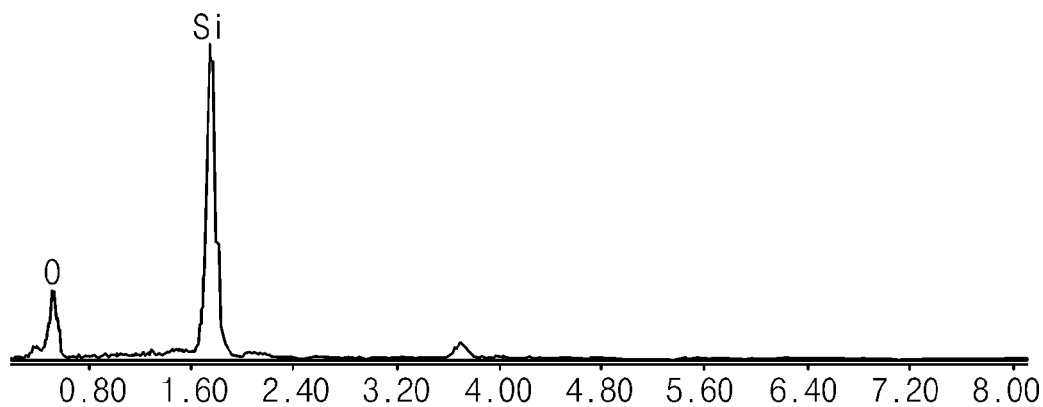
FIG. 8 is an EDX graph showing a substrate that has the crystallized silicon layer after reaction of thermite formed on an amorphous substrate having an insulating layer and a metal layer.

FIGS. 7 and 8 are respectively a photographic view and an EDX graph showing the substrate 10 that is crystallized after the thermite layer 40 is formed on the amorphous substrate having the insulating layer 31 and the metal layer 33. As shown in FIG. 7, when the double layer of the insulating layer 31 and the metal layer 33 is provided, the polycrystalline silicon layer 24' is uniformly formed, and metal impurities used for the thermite layer 40 are rarely observed in the substrate 10.

When the double layer is provided, the thickness of the insulating layer 31 may be adjusted according to the desired polycrystalline silicon layer 24' or surrounding conditions. As the insulating layer 31 becomes thinned, a degree of crystallization is improved. If the insulating layer 31 having a relatively large thickness is formed, heat may not be sufficiently transferred to the amorphous silicon layer 24 due to an insulating substance having a characteristic heat insulating effect.

Figure 9A:
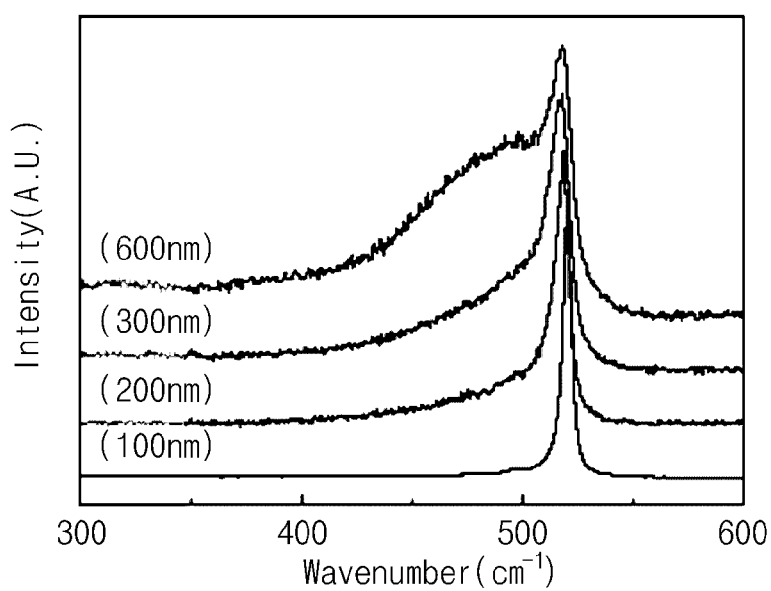
FIGS. 9A and 9B are graphs showing Raman spectroscopy of a crystallized silicon thin film with various thickness of metal layer and an FWHM according to the thickness of the metal layer, respectively.
Figure 9B:
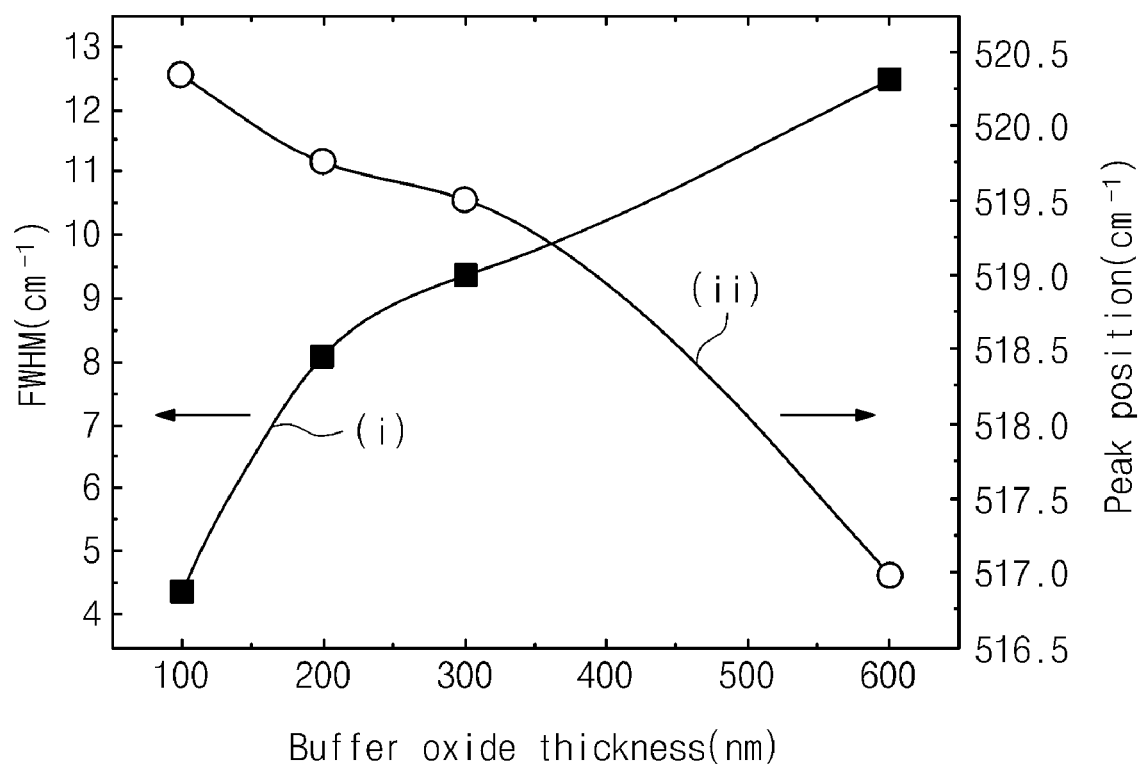

FIGS. 9A and 9B are respectively graphs showing Raman spectroscopy of a crystallized silicon thin film according to variations in the thickness of the insulating layer 31 and showing the size (see curve (i) of FIG. 9B) of full width of half maximum (FWHM) and a peak position (see curve (ii)) according to the thickness (marked as "buffer oxide thickness" in drawings) of the insulating layer 31. The FWHM represents a peak width at a half position of the maximum peak intensity in the Raman spectroscopy.

Referring to FIGS. 9A and 9B, as the thickness of the insulating layer 31 becomes smaller, the peak of the silicon layer goes closer to corresponding to a peak of just polycrystalline silicon. As the thickness of the insulating layer 31 (buffer oxide) becomes greater, the FWHM is gradually increased, resulting in appearance of the peak of amorphous silicon remarkably even when the thickness of the insulating layer 31 is as large as about 600 nm. As shown in FIG. 9B, when the thickness of the insulating layer 31 is about 100 nm, a peak appears at about 520 $cm^{-1}$ which is a peak position of polycrystalline silicon. However, as the thickness of the insulating layer 31 increases, the peak moves into closer correspondence with a peak position of the amorphous silicon, resulting in appearance of the peak appears at a peak position of about 517 $cm^{-1}$ when the thickness of the insulating layer 31 is about 600 nm. In addition, when the thickness of the insulating layer 31 is about 100 nm, the FWHM is about 4 $cm^{-1}$. When the thickness of the insulating layer 31 is about 600 nm, the FWHM is about 12 $cm^{-1}$ and more. In this case, it can be recognized from FIG. 9A that the FWHM is enlarged due to overlap with the peak of the amorphous silicon.

As a result, the insulating layer 31 preferably has the thickness sufficient to prevent metal of the metal layer 33 from forming metal silicide and also to prevent infiltration of metal of the thermite layer 40 but also thin enough to assure substantial crystallization.

As described above, in the method of crystallizing amorphous silicon according to the present disclosure, the insulating layer 31 and the metal layer 33 are formed to uniformly transfer heat, thereby forming uniform polycrystalline silicon while minimizing the infiltration of impurities.

In addition, since a high-temperature heat is applied to a narrow region for a short time through a local heat treatment technology, the method of crystallizing amorphous silicon according to the present disclosure is applicable to a substrate having sensitivity to heat. In particular, the method of crystallizing amorphous silicon according to the present disclosure may be applicable to a flexible substrate such as a plastic substrate.

A silicon thin film crystallized according to an exemplary embodiment may be used when a semiconductor device such as a thin film transistor, a solar battery, or an image sensor is to be manufactured. The thin film transistor employing the crystallized silicon thin film can be used for various display apparatuses such as a liquid crystal displays and an organic electro-luminescence displays. Hereinafter, the thin film transistor including the crystallized silicon thin film and a liquid crystal panel having the same will be described as an example.

Hereinafter, a method for manufacturing a liquid crystal display (LCD) according to an embodiment of the present disclosure will be described in detail with reference to accompanying drawings.

Figure 10:
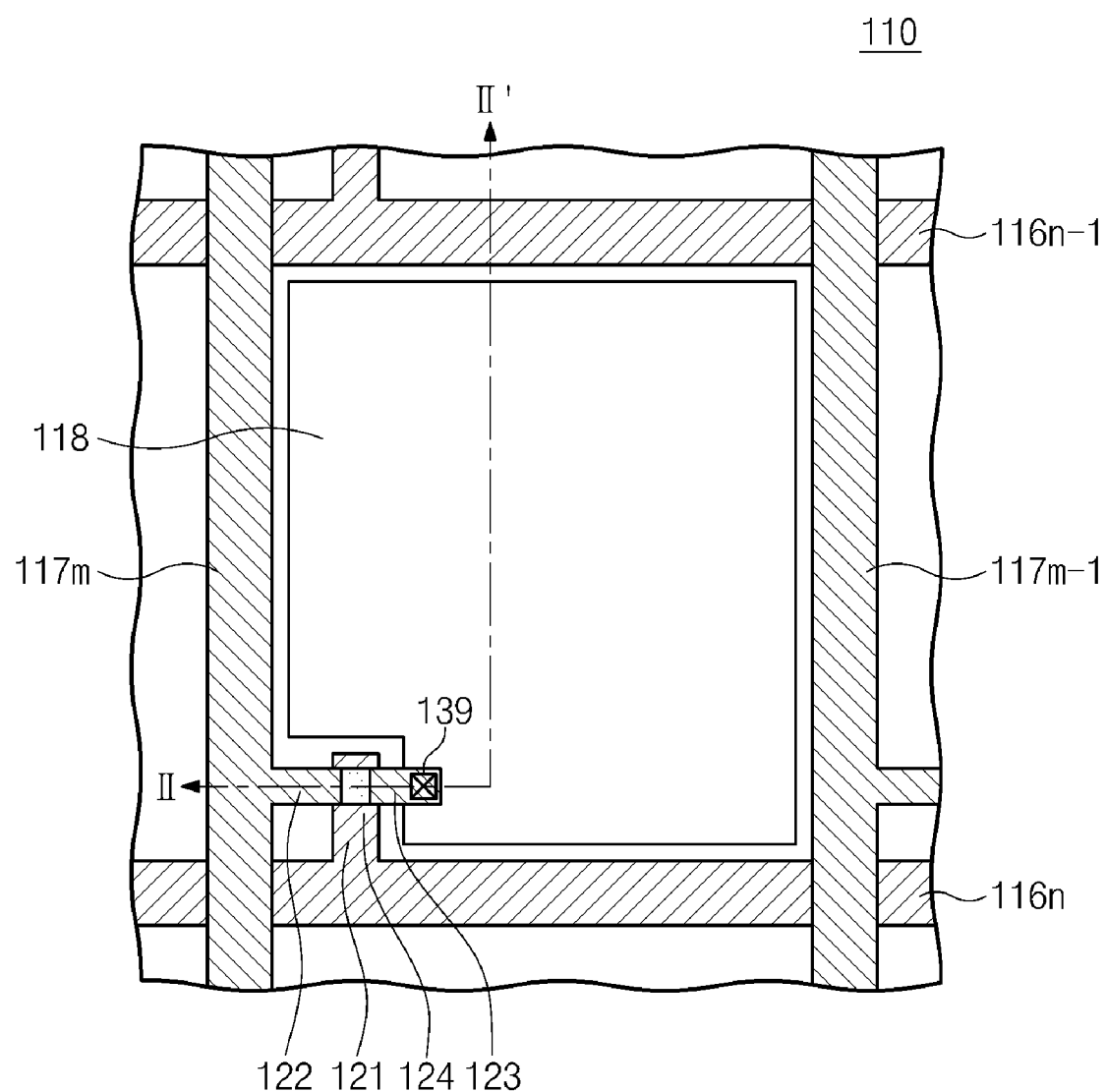
FIG. 10 is a plan view showing a portion of a thin film transistor substrate of an LCD according to an exemplary embodiment.

FIG. 10 is a plan view showing a portion of a thin film transistor substrate 110 of the LCD according to an exemplary embodiment. Although the thin film transistor substrate 110 includes N gate lines and M data lines crossing each other to form M×N pixel areas, only an $(M \times N)^{th}$ one of the pixels is shown in FIG. 10 for the convenience of explanation.

As shown in FIG. 10, the thin film transistor substrate 110 is provided. On the thin film transistor substrate an $n^{th}$ gate line 116n and an $m^{th}$ data line 117m are formed and arranged horizontally and vertically to define an $(m \times n)^{th}$ pixel area. A thin film transistor, which is a switching element, is formed at an interconnection area of the $n^{th}$ gate line 116n and the $m^{th}$ data line 117m, and a pixel electrode 118 is connected to the thin film transistor in the $(m \times n)^{th}$ pixel area to drive liquid crystal material (not shown) in cooperation with a common electrode of a color filter substrate (not shown).

The thin film transistor includes a gate electrode 121 connected to or formed as a portion of the $n^{th}$ gate line 116n, a source electrode 122 connected to the $m^{th}$ data line 117m, and a drain electrode 123 connected to the pixel electrode 118. In addition, the thin film transistor includes a first insulating layer (not shown) to insulate the gate electrode 121 from the source and drain electrodes 122 and 123 and an active pattern (not shown) used to form a conductive channel between the source electrode 122 and the drain electrode 123 by a gate voltage applied to the gate electrode 121.

A portion of the source electrode 122 is connected to the $m^{th}$ data line 117m to form a portion of the $m^{th}$ data line 117m, and a portion of the drain electrode 123 extends to the pixel area to be electrically connected to the pixel electrode 118 through a contact hole 139 formed in a second insulating layer (not shown).

Hereinafter, the manufacturing process of the thin film transistor substrate 110 having the above structure according to the present embodiment will be described.

FIGS. 11A to 11E are sectional views taken along line XII-XII' of the thin film transistor substrate 110 shown in FIG. 10 to sequentially show the manufacturing process of the thin film transistor substrate 110.

Figure 11A:
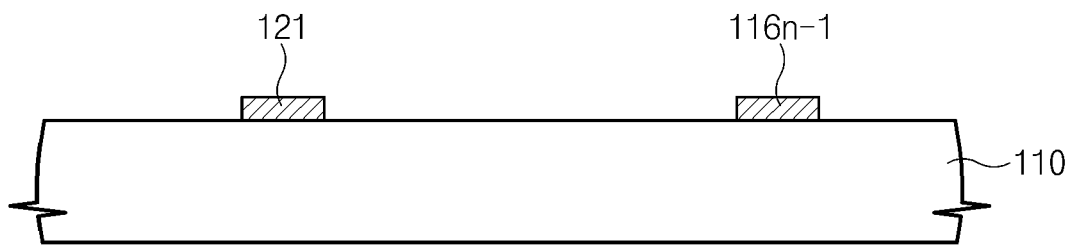
FIGS. 11A to 11E are sectional views taken along line XII-XII' of a thin film transistor substrate shown in FIG. 10 to sequentially show the manufacturing process of the thin film transistor substrate.

As shown in FIG. 11A, a patterned gate electrode 121 and a patterned gate line 116n-1 are formed on a thin film transistors supporting substrate (TFT substrate) 110 where a top major surface of substrate 110 is composed of a transparent insulating material such as a glass or a plastic. In this case, the gate electrode 121 and the gate line 116n-1 may be formed by depositing a first conductive film on the entire surface of the thin film transistor substrate 110 and then patterning the first conductive film through a photolithography process.

Figure 11B:
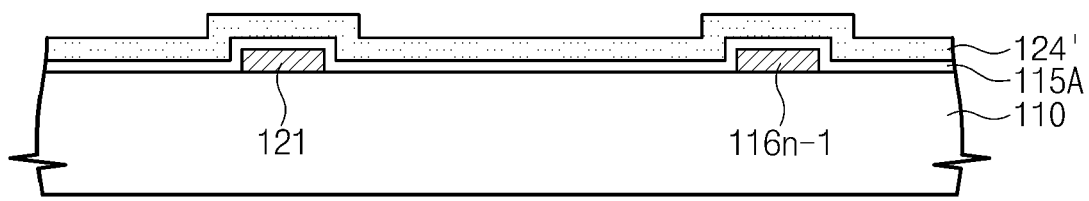
Figure 12A:
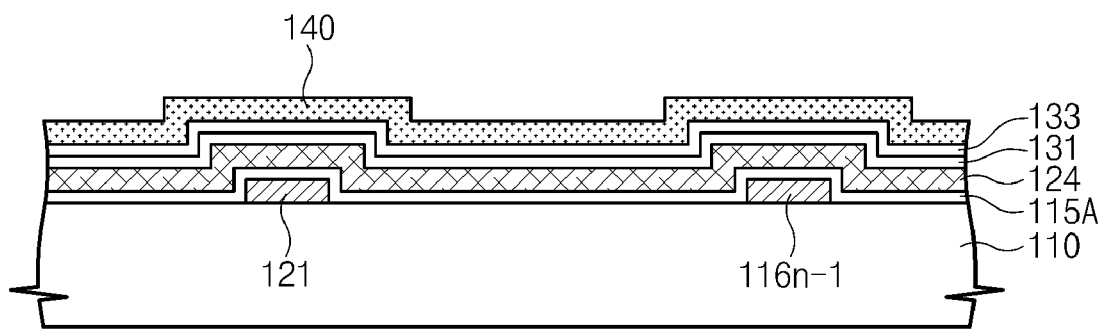
FIGS. 12A and 12B are sectional views showing the manufacturing process of crystallizing an amorphous silicon layer.
Figure 12B:
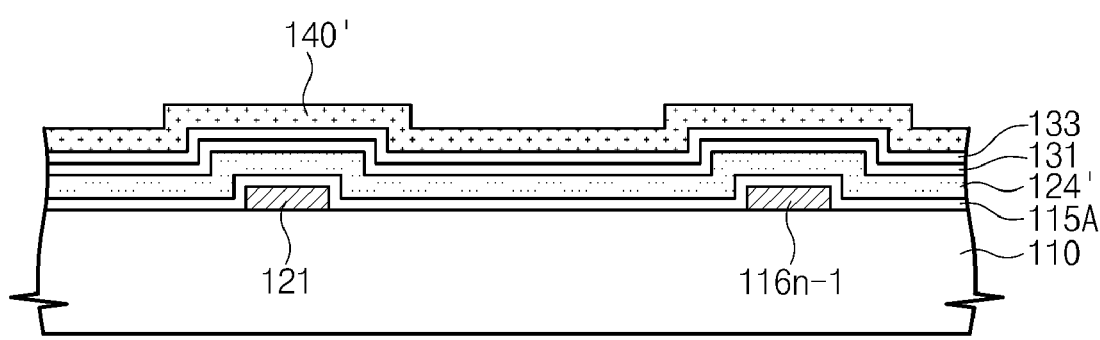

Next, as shown in FIG. 11B, after sequentially depositing a gate insulating layer 115A and an amorphous silicon layer 124 (see FIG. 12A) on the entire surface of the thin film transistor substrate 110 which has the gate electrode 121 and the gate line 116n-1 preformed thereon, the amorphous silicon layer 124 is crystallized to a polycrystalline silicon layer 124' using reaction of a first thermite layer 140 (see intermediate step shown in FIG. 12B).

FIGS. 12A and 12B are sectional views showing a process of crystallizing the amorphous silicon layer 124. Referring to FIG. 12A, an insulating layer 131 is formed on the entire surface of the thin film transistor substrate 110 having the gate electrode 121 and the gate line 116n-1 by using an insulating substance such as a silicon oxide (SiOx), and then a metal layer 133 is formed on the entire surface of the thin film transistor substrate 110.

Thereafter, as shown in FIG. 12B, the first thermite layer 140 is formed on the thin film transistor substrate 110 having the metal layer 133. The first thermite layer 140 may be blanket formed on the entire surface of the thin film transistor substrate 110 through a spin coating process, or selectively formed across the surface using an ink-jetting, or a printing process. In one embodiment, the first thermite layer 140 is formed only on a preset region of the thin film transistor substrate 110 corresponding to where polysilicon is to be formed through crystallization of amorphous silicon.

Then, the thin film transistor substrate 110 is heated to ignite the reaction of the first thermite layer 140, so that heat is released to crystallize the amorphous silicon layer 124, thereby forming the polycrystalline silicon layer 124'.

In this case, a post-ignition or second thermite layer 140' after the thermite reaction, and the metal layer 133 and the insulating layer 131 formed below the second thermite layer 140' may be selectively removed if so desired by selective CMP or other selective removal processes as deemed appropriate.

FIG. 11B shows a polycrystalline silicon substrate obtained by removing the second thermite layer 140', the metal layer 133, and the insulating layer 131.

Figure 11C:
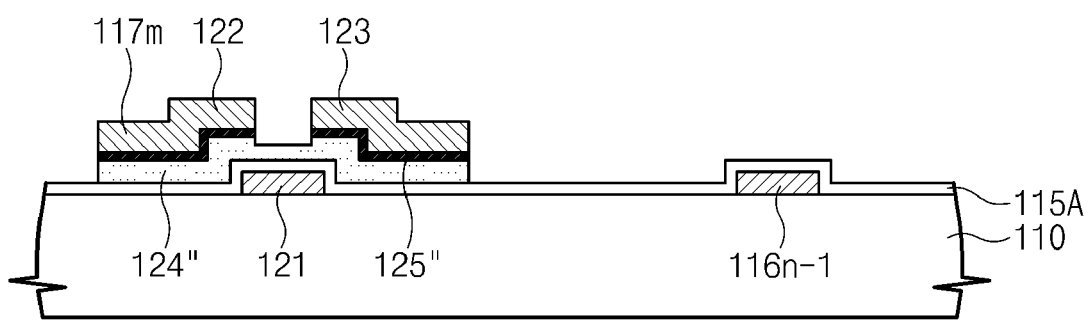

Thereafter, as shown in FIG. 11C, after implanting impurity ions onto the polycrystalline silicon layer 124' and depositing a second conductive layer (122, 123, 125) on the resultant structure, the polycrystalline silicon layer 124' and the second conductive layer are selectively patterned through a photolithography process, thereby forming a patterned active pattern 124" including a polycrystalline silicon channel region disposed over the gate electrode 121 and also forming the spaced-apart source electrode 122 and the drain electrode 123 on opposed sides of the channel region where each of the source and drain electrodes 122, 123 is defined by a respective patterned section of the second conductive layer (122, 123, 125).

The ohmic contact layer 125" portion of the second conductive layer is formed on the active pattern 124". Under the ohmic contact layer 125", a heavily doped, n+ polycrystalline silicon layer is patterned in the same shape as that of the source electrode 122 and the drain electrode 123, such that a predetermined region of the active pattern 124" makes good ohmic-contact with the source and drain electrodes 122 and 123. In this case, the source electrode 122 corresponds to a portion of a data line 117m crossing the gate line 116n-1 to define a pixel area.

Although for the illustrated embodiment the active pattern 124", the ohmic-contact layer 125", the source electrode 122, and the drain electrode 123 are simultaneously formed through one photolithography process using a diffraction mask or a half-tone mask, the present disclosure is not limited to such one-step patterning. For example, according to another exemplary embodiment, after implanting impurity ions onto the polycrystalline silicon layer 124', the resultant structure is selectively patterned through a photolithography process to form the active pattern 124" and the ohmic-contact layer 125". Then, after depositing the second conductive layer on the entire surface of the thin film transistor substrate 110, a photolithography process may be performed to form the source and drain electrodes 122 and 123.

Figure 11D:
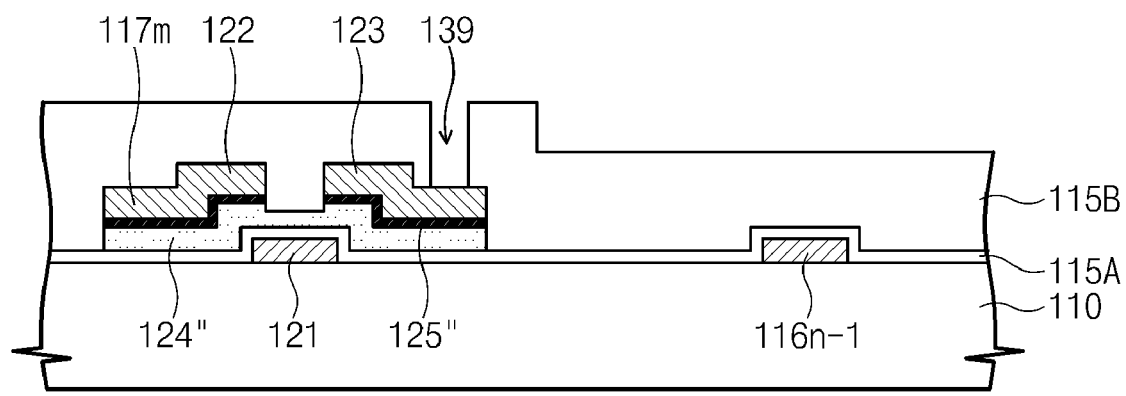

Then, as shown in FIG. 11D, after depositing a protective layer 115B (transparent passivation layer) on the entire surface of the thin film transistor substrate 110 having the source and drain electrodes 122 and 123, a portion of the protective layer 115B is removed through a photolithography process to form the drain contact hole 139 exposing a portion of the drain electrode 123.

Figure 11E:
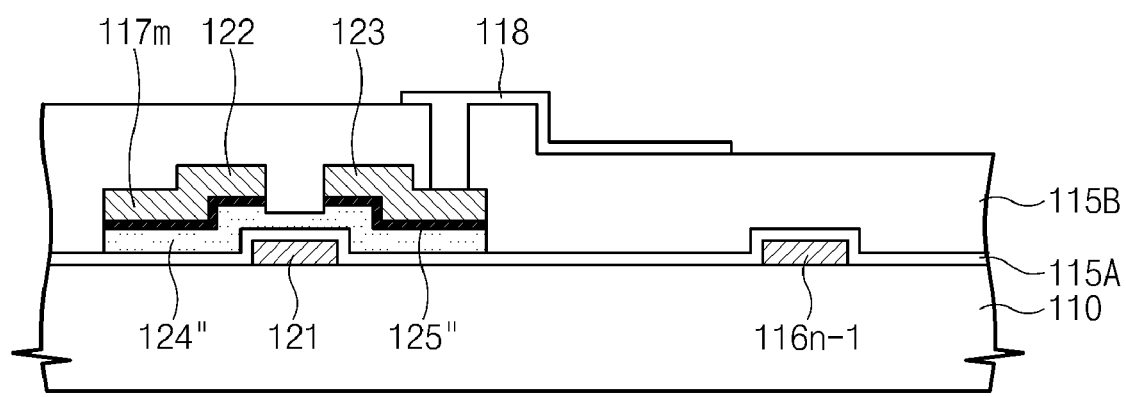

Thereafter, as shown in FIG. 11E, after depositing a transparent conductive material (e.g., ITO, IZO) on the entire surface of the thin film transistor substrate 110, the resultant structure is selectively patterned through the photolithography process, thereby forming a pixel electrode 118 electrically connected with the drain electrode 123 through the contact hole 139.

In this case, the transparent material includes indium tin oxide (ITO) or indium zinc oxide (IZO), which have optical transmittance.

The thin film transistor substrate 110 having the above structure is aligned in opposition to a color filters substrate (not shown) by a sealant (not shown) formed on an outer peripheral portion of an image display area, and a liquid crystal layer is interposed between the two substrates, that is, the thin film transistors substrate 110 and the color filters substrate, thereby constructing a liquid crystal panel.

Although the thin film transistor substrate 110 of the LCD has been described as an example according to one embodiment, the present disclosure is not limited to just LCD's. In other words, the here disclosed technique of forming TFT's having a crystallized active layer is applicable to other display technologies where formation of a transistor or other electronic switching element is desirable. For example, the here disclosed technique may be applicable to other display apparatuses including a thin film transistor, for example, an organic electro-luminescence display, in which a driving transistor is connected to an organic light emitting diode (OLED), or a plasma display panel (PDP) display.

Although exemplary embodiments have been described, it is understood that the present disclosure should not be limited to these exemplary embodiments but various changes and modifications can be made by one ordinary skilled in the art in view of the present disclosure and within the spirit and scope of the present disclosure.

What is claimed is:

1. A method of forming crystallized silicon, the method comprising:
   forming an amorphous silicon layer on a substrate;
   forming an insulating layer on top of the amorphous silicon layer;
   forming a metal layer on the insulating layer;
   forming a thermite layer on the metal layer; and
   applying heat to the thermite layer to thereby ignite an exothermic reaction in the thermite layer and thereby generate sufficient localized heat for crystallizing at least a top portion of the amorphous silicon layer.

2. The method of claim 1, wherein the insulating layer comprises at least one of a silicon oxide (SiOx) and a silicon nitride (SiNx).

3. The method of claim 2, wherein the insulating layer has a thickness in a range of about 100 nm to about 600 nm.

4. The method of claim 1, wherein the metal layer is a heat conducting layer comprising at least one metal selected from the group consisting of silver (Ag), copper (Cu), gold (Au), aluminum (Al), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), and niobium (Nb), or comprising an alloy of two or more of said metals.

5. The method of claim 1, wherein the thermite layer comprises mixture of particles of metal and particles of one or more metal oxides.

6. The method of claim 5, wherein the combination of the aluminum particles and the particles of one or more metal oxides has a post-ignition reaction temperature of about 1000° C. or more under adiabatic conditions.

7. The method of claim 6, wherein the metal oxide is an oxide of at least one metal selected from the group consisting of silver (Ag), iron (Fe), nickel (Ni), titanium (Ti), cobalt (Co), chromium (Cr), vanadium (V), thallium (Tl), molybdenum (Mo), tungsten (W), niobium (Nb), boron (B), lead (Pb), manganese (Mn), silicon (Si), and uranium (U).

8. The method of claim 5, wherein the thermite layer is formed from a composition comprising a selectively removable dispersion medium in which the particles of aluminum (Al) and the particles of metal oxide are dispersed.

9. The method of claim 8, wherein the thermite layer forming composition is spin-coated onto said metal layer.

10. The method of claim 9, further comprising selectively removing the dispersion medium.

11. The method of claim 8, wherein the thermite layer is formed on the metal layer through an ink jetting process.

12. The method of claim 11, further comprising selectively removing the dispersion medium.

13. The method of claim 5, wherein heat applied to the thermite layer has a temperature exceeding a predetermined ignition temperature for igniting an exothermic reaction between the particles of metal oxide and of the aluminum (Al).

14. The method of claim 1, wherein the substrate is a flexible substrate.

15. The method of claim 14, wherein the substrate includes a plastic layer.

16. A method of fabricating a thin film transistor on a substrate, the method comprising:
   forming a gate electrode on the substrate;
   forming a gate insulating layer on the substrate;
   forming an amorphous silicon layer on the gate insulating layer;
   forming an insulating layer on top of the amorphous silicon layer;
   forming a metal layer on the insulating layer;
   forming a thermite layer on the metal layer;
   applying heat to the thermite layer to thereby ignite an exothermic heat releasing reaction in the thermite layer and thereby generate sufficient localized heat for crystallizing at least a top portion of the amorphous silicon layer; and
   forming source and drain electrodes on the crystallized at least a top portion of the silicon layer.

17. The method of claim 16, further comprising removing the insulating layer, the metal layer, and the thermite layer after the reaction is completed.

18. The method of claim 16, wherein the insulating layer comprises a silicon oxide (SiOx) or a silicon nitride (SiNx).

19. The method of claim 18, wherein the insulating layer has a thickness in a range of about 100 nm to about 600 nm.

20. The method of claim 16, wherein the metal layer comprises at least one metal selected from the group consisting of silver (Ag), copper (Cu), gold (Au), aluminum (Al), rhodium (Rh), iridium (Ir), tungsten (W), molybdenum (Mo), cobalt (Co), zinc (Zn), nickel (Ni), cadmium (Cd), ruthenium (Ru), osmium (Os), platinum (Pt), palladium (Pd), tin (Sn), rubidium (Rb), chromium (Cr), tantalum (Ta), and niobium (Nb), or comprises an alloy of two or more of said metals.

21. The method of claim 16, wherein the thermite layer comprises mixture of nano-particles of aluminum (Al) and nano-particles of metal oxide.

22. The method of claim 21, wherein the combination of particles of aluminum and particles of metal oxide has a reaction temperature of about 1000° C. or more under adiabatic conditions.

23. The method of claim 22, wherein the metal oxide is an oxide of at least one metal selected from the group consisting of silver (Ag), iron (Fe), nickel (Ni), titanium (Ti), cobalt (Co), chromium (Cr), vanadium (V), thallium (Tl), molybdenum (Mo), tungsten (W), niobium (Nb), boron (B), lead (Pb), manganese (Mn), silicon (Si), and uranium (U).

24. The method of claim 21, wherein the thermite layer further comprises a dispersion medium to disperse the nano-particles of the aluminum (Al) and nano-particles of the metal oxide.

25. The method of claim 24, wherein the thermite layer is formed on the metal layer through a spin-coating.

26. The method of claim 24, further comprising removing the dispersion medium of the thermite layer formed on the metal layer.

27. The method of claim 24, wherein the thermite layer is formed on the metal layer through an ink-jetting.

28. The method of claim 27, further comprising removing the dispersion medium of the thermite layer formed on the metal layer.

29. The method of claim 21, wherein heat applied to the thermite layer has a temperature exceeding an ignition temperature for reaction between the metal oxide and the aluminum (Al).

30. The method of claim 16, wherein the substrate is a flexible substrate.

31. The method of claim 16, wherein the substrate includes a plastic layer.

32. A method of fabricating a liquid crystal display, the method comprising:
   preparing a first substrate;
   preparing a second substrate facing the first substrate;

forming a gate electrode on the first substrate;
forming a gate insulating layer on the first substrate having the gate electrode;
forming an amorphous silicon layer on the gate insulating layer;
forming an insulating layer on the amorphous silicon layer;
forming a metal layer by coating a metal material on the insulating layer;
forming a thermite layer on the metal layer;
applying heat to the thermite layer in order to ignite the thermite and use its localized heat to crystallize the amorphous silicon layer;
removing the insulating layer, the metal layer, and the thermite layer;
forming a source electrode and a drain electrode on the first substrate having the crystallized silicon layer;
forming a protective layer on the source and drain electrodes, the protective layer having a contact hole exposing a portion of the drain electrode;
forming a pixel electrode connected to the drain electrode through the contact hole; and
interposing a liquid crystal layer between the first and second substrates.

* * * * *